United States Patent
Sato et al.

(10) Patent No.: US 7,277,270 B2
(45) Date of Patent: Oct. 2, 2007

(54) MULTILAYER FILTER

(75) Inventors: Takahiro Sato, Tokyo (JP); Kentaro Yoshida, Tokyo (JP); Masashi Orihara, Tokyo (JP); Shumi Kumagai, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/525,138

(22) Filed: Sep. 22, 2006

(65) Prior Publication Data

US 2007/0069836 A1    Mar. 29, 2007

(30) Foreign Application Priority Data

Sep. 29, 2005   (JP)   ............................ P2005-285250

(51) Int. Cl.
*H01G 4/06* (2006.01)

(52) U.S. Cl. ................ 361/321.1; 361/321.2; 361/306.1; 361/306.3; 361/311; 361/313; 333/184; 333/185

(58) Field of Classification Search ............ 361/321.1, 361/321.2, 311, 313, 306.1, 306.3, 308.1, 361/309; 333/184, 185; 338/323, 217
See application file for complete search history.

(56) References Cited

U.S. PATENT DOCUMENTS

| | | | | |
|---|---|---|---|---|
| 5,126,707 A | * | 6/1992 | Ikeda | .................. 333/185 |
| 5,159,300 A | * | 10/1992 | Nakamura et al. | .......... 333/184 |
| 6,700,772 B2 | * | 3/2004 | Raghavendra et al. | ... 361/321.2 |
| 7,085,118 B2 | * | 8/2006 | Inoue et al. | ................ 361/119 |
| 7,154,374 B2 | * | 12/2006 | Ritter et al. | ................ 338/323 |

FOREIGN PATENT DOCUMENTS

| | | |
|---|---|---|
| JP | A 3-274815 | 12/1991 |
| JP | A 8-250309 | 9/1996 |
| JP | B2 2716022 | 11/1997 |
| JP | A 2000-182833 | 6/2000 |
| JP | A 2001-203552 | 7/2001 |

* cited by examiner

*Primary Examiner*—Nguyen T. Ha
(74) *Attorney, Agent, or Firm*—Oliff & Berridge, PLC

(57) ABSTRACT

An objective is to provide a multilayer filter capable of preventing an electric current rapidly flowing by virtue of varistor effect, from passing as noise, upon application of noise of a high voltage over a varistor voltage to its input. A multilayer filter has an inductor part 10 and a varistor part 20 in a laminate 2, and the inductor part 10 has the DC resistance of 4 $\Omega$-100 $\Omega$. This prevents an electric current rapidly flowing by virtue of the varistor effect, from passing as noise, upon application of noise of a high voltage over the varistor voltage to the input.

3 Claims, 10 Drawing Sheets

US 7,277,270 B2

MULTILAYER FILTER

BACKGROUND OF THE INVENTION

1. Field of the Invention

The present invention relates to a multilayer filter.

2. Related Background Art

A conventionally known multilayer filter is one having an inductor part and a varistor part (e.g., Japanese Patent No. 2716022). The multilayer filter of this type exhibits the varistor effect with rapid flow of an electric current upon application of noise of a high voltage over a varistor voltage to its input.

SUMMARY OF THE INVENTION

In the multilayer filter as described above, however, there are cases where the electric current rapidly flowing by virtue of the varistor effect passes as noise through the multilayer filter. Since the varistor part originally has some capacitance, it has noise cancellation action to prevent the rapidly flowing current from becoming noise. However, for example, in a case where the multilayer filter is downsized, so as to decrease the capacitance of the varistor part, the noise cancellation action degrades, so that the rapidly flowing current can pass as noise through the multilayer filter.

The present invention has been accomplished in view of the above circumstances and an object of the invention is therefore to provide a multilayer filter capable of preventing an electric current rapidly flowing by virtue of the varistor effect, from passing as noise, upon application of noise of a high voltage over the varistor voltage to its input.

In order to achieve the above object, a multilayer filter according to the present invention is a multilayer filter comprising: a laminate having a first multilayer portion comprising a stack of insulator layers, and a second multilayer portion comprising a stack of varistor layers; a first terminal electrode, a second terminal electrode, and a third terminal electrode formed on the laminate; an inductor part which is constructed so that a plurality of conductor portions formed in the first multilayer portion are electrically connected to each other, one end of which is electrically connected to the first terminal electrode, and an other end of which is electrically connected to the second terminal electrode; and a varistor part which is constructed so that a first varistor electrode electrically connected to the first terminal electrode or to the second terminal electrode, and a second varistor electrode electrically connected to the third terminal electrode are formed in the second multilayer portion with the varistor layer in between; wherein the inductor part has a DC resistance of 4 Ω-100 Ω.

This multilayer filter comprises the inductor part and the varistor part, and the inductor part has the DC resistance of 4 Ω-100 Ω. This achieves the effect of preventing an electric current rapidly flowing by virtue of the varistor effect, from passing as noise, upon application of noise of a high voltage over the varistor voltage to the input (so called dumping effect).

In the multilayer filter according to the present invention, preferably, the conductor portions are made of a material containing silver (Ag) and palladium (Pd). This permits the DC resistance of the inductor part to be securely set higher, for example, in comparison with a case where the conductor portions are made of a material consisting primarily of Ag. Furthermore, the melting point of the conductor portions can be securely increased, for example, in comparison with the case where the conductor portions are made of the material consisting primarily of Ag. For this reason, when the laminate is baked in a production process of the multilayer filter, the laminate can be integrally baked at a baking temperature of the second multilayer portion generally higher than that of the first multilayer portion.

In the multilayer filter according to the present invention, preferably, an intermediate layer having a coefficient of thermal expansion between that of the insulator layers and that of the varistor layers is laid between the first multilayer portion and the second multilayer portion. This can prevent occurrence of a crack or delamination in the laminate due to the difference between the coefficient of thermal expansion of the insulator layers and the coefficient of thermal expansion of the varistor layers. Furthermore, it can prevent diffusion of a component from the insulator layers into the varistor layers and diffusion of a component from the varistor layers into the insulator layers and enables the characteristics of the insulator layers and the characteristics of the varistor layers to be maintained at respective predetermined characteristics.

DESCRIPTION OF THE PREFERRED EMBODIMENTS

Figure 1:
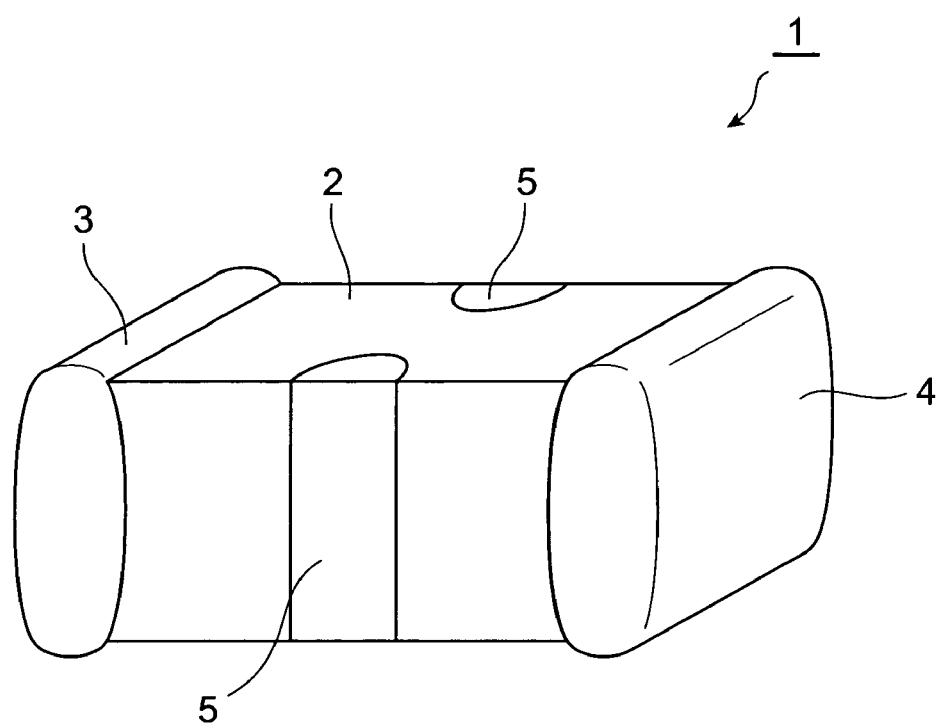
FIG. 1 is a perspective view of a multilayer filter according to the first embodiment.

The preferred embodiments of the multilayer filter according to the present invention will be described below in detail with reference to the drawings. In the drawings identical or equivalent portions will be denoted by the same reference symbols, without redundant description.

First Embodiment

As shown in FIG. 1, a multilayer filter 1 has a laminate 2 of a rectangular parallelepiped shape. In the laminate 2, an input terminal electrode (first terminal electrode) 3 and an output terminal electrode (second terminal electrode) 4 are formed at the both ends of the laminate 2 in the longitudinal direction thereof, and a pair of ground terminal electrodes (third terminal electrodes) 5 are formed on two side faces in the direction perpendicular to the longitudinal direction.

Figure 2:
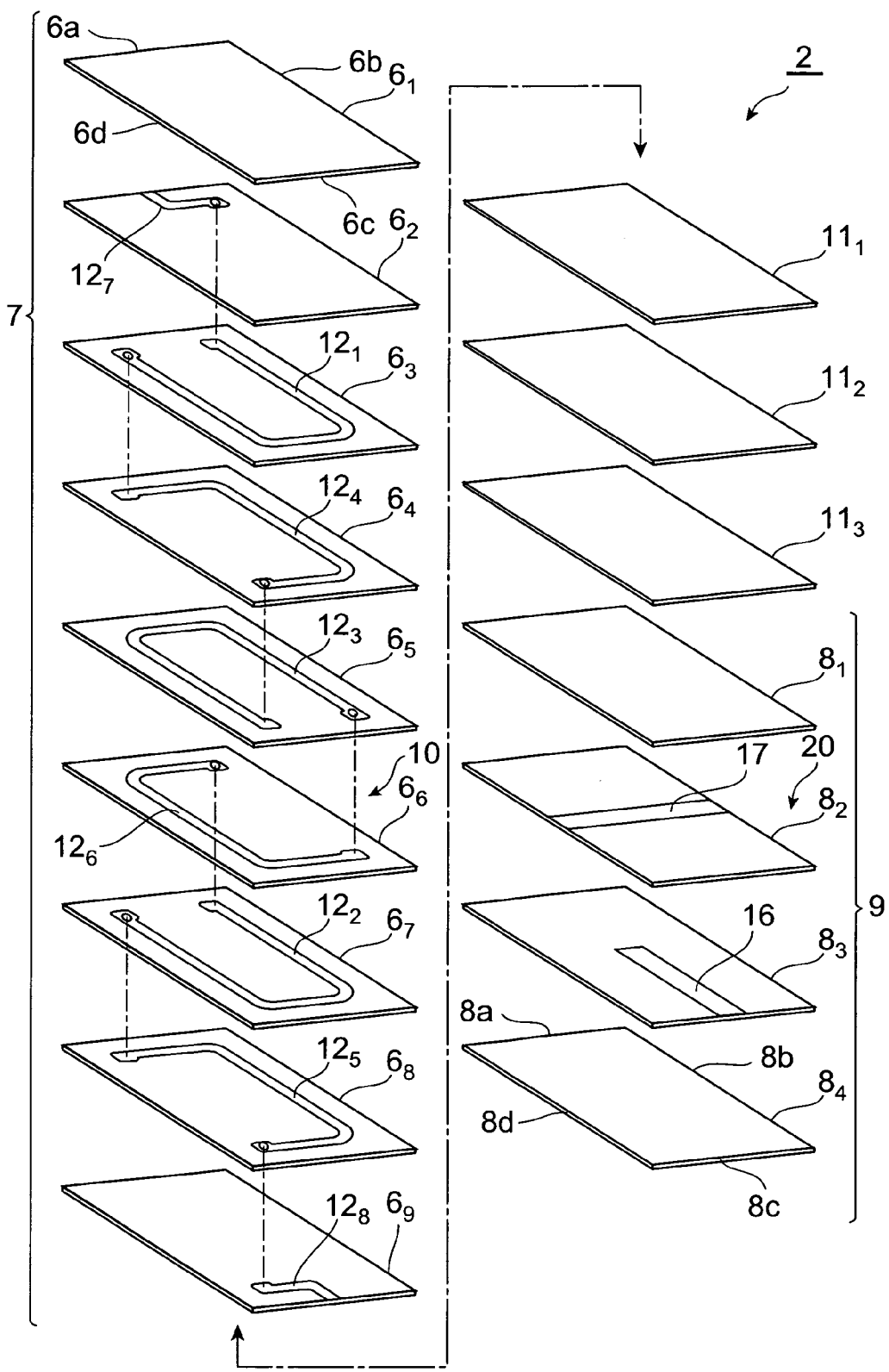
FIG. 2 is an exploded perspective view of a laminate in the multilayer filter according to the first embodiment.

The laminate 2, as shown in FIG. 2, is constructed so that a multilayer portion (first multilayer portion) 7 consisting of a stack of insulator layers $6_1$-$6_9$, a multilayer portion (second multilayer portion) 9 consisting of a stack of varistor layers $8_1$-$8_4$, and a plurality of intermediate layers $11_1$-$11_3$ located between the multilayer portion 7 and the multilayer portion 9 are stacked in a stack direction of the multilayer portions 7, 9.

The insulator layers $6_1$-$6_9$ are made of an electrically insulating material and in a rectangular thin plate shape and have edges 6a, 6b, 6c, and 6d in clockwise order from the edge where the input terminal electrode 3 is formed. The varistor layers $8_1$-$8_4$ are made of a material with current-voltage nonlinearity and in a rectangular thin plate shape and have edges 8a, 8b, 8c, and 8d in clockwise order from the edge where the input terminal electrode 3 is formed. Furthermore, the intermediate layers $11_1$-$11_3$ are made of a material having the coefficient of thermal expansion falling between that of the insulator layers $6_1$-$6_9$ and that of the varistor layers $8_1$-$8_4$, and in a rectangular thin plate shape.

In the multilayer portion 7, conductor portions $12_1$, $12_2$ are formed on the insulator layers $6_3$, $6_7$, respectively, so as to extend along the edge 6b, edge 6c, and edge 6d, and a conductor portion $12_3$ is formed on the insulator layer $6_5$ so as to extend along the edge 6d, edge 6a, and edge 6b. Furthermore, conductor portions $12_4$, $12_5$ are formed on the insulator layers $6_4$, $6_8$, respectively, so as to extend along the edge 6a, edge 6b, and edge 6c, and a conductor portion $12_6$ is formed on the insulator layer $6_6$ so as to extend along the edge 6c, edge 6d, and edge 6a. Furthermore, a conductor portion $12_7$ connected to the input terminal electrode 3 is formed on the insulator layer $6_2$, and a conductor portion $12_8$ connected to the output terminal electrode 4 is formed on the insulator layer $6_9$.

An end of the conductor portion $12_1$ on the edge 6d side and on the edge 6a side and an end of the conductor portion $12_4$ on the edge 6d side and on the edge 6a side are electrically connected to each other through a through-hole formed in the insulator layer $6_3$. An end of the conductor portion $12_4$ on the edge 6c side and on the edge 6d side and an end of the conductor portion $12_3$ on the edge 6c side and on the edge 6d side are electrically connected to each other through a through-hole formed in the insulator layer $6_4$, and an end of the conductor portion $12_3$ on the edge 6b side and on the edge 6c side and an end of the conductor portion $12_6$ on the edge 6b side and on the edge 6c side are electrically connected to each other through a through-hole formed in the insulator layer $6_5$. Furthermore, an end of the conductor portion $12_6$ on the edge 6a side and on the edge 6b side and an end of the conductor portion $12_2$ on the edge 6a side and on the edge 6b side are electrically connected to each other through a through-hole formed in the insulator layer $6_6$, and an end of the conductor portion $12_2$ on the edge 6d side and on the edge 6a side and an end of the conductor portion $12_5$ on the edge 6d side and on the edge 6a side are electrically connected to each other through a through-hole formed in the insulator layer $6_7$.

Furthermore, ends of the conductor portion $12_7$ and the conductor portion $12_1$ on the edge 6a side and on the edge 6b side are electrically connected to each other through a through-hole formed in the insulator layer $6_2$, and ends of the conductor portion $12_8$ and the conductor portion $12_5$ on the edge 6c side and on the edge 6d side are electrically connected to each other through a through-hole formed in the insulator layer $6_8$.

In the configuration as described above, the multilayer filter 1 has the inductor part 10 constructed so that the plurality of conductor portions $12_1$-$12_8$ formed in the multilayer portion 7 are electrically connected, and the inductor part 10 is so arranged that one end thereof is electrically connected to the input terminal electrode 3 and that the other end thereof is electrically connected to the output terminal electrode 4. The conductor portions $12_1$-$12_8$ are made of a material containing Ag and Pd, and the inductor part 10 has the DC resistance of 4 Ω-100 Ω at its both ends.

In the multilayer portion 9, a hot electrode (first varistor electrode) 16, one end of which reaches the edge 8c to be electrically connected to the output terminal electrode 4, is formed on the varistor layer $8_3$ so as to extend along the edge 8b in the central region thereof. In addition, a ground electrode (second varistor electrode) 17, the two ends of which reach the edge 8b and the edge 8d to be electrically connected to the ground terminal electrodes 5, is formed on the varistor layer $8_2$ so as to extend along the edge 8a in the central region thereof In this configuration, the multilayer filter 1 has the varistor part 20 constructed so that the hot electrode 16 electrically connected to the output terminal electrode 4, and the ground electrode 17 electrically connected to the ground terminal electrodes 5 are formed in the multilayer portion 9 with the varistor layer $8_2$ in between. The hot electrode 16 and ground electrode 17 are made of a material containing Ag and Pd.

Next, a production method of the aforementioned multilayer filter 1 will be described.

The first step is to prepare green sheets for insulator layers $6_1$-$6_9$. The green sheets are formed, for example, by applying a slurry of a raw material, such as Ni—Cu—Zn ferrite, Ni—Cu—Zn—Mg ferrite, or Ni—Cu ferrite, onto a film by the doctor blade method so as to form a membrane, for example, in the thickness of about 20 μm.

In addition, green sheets for varistor layers $8_1$-$8_4$ are also prepared. The green sheets are formed, for example, by applying a slurry of a raw material of mixed powders of ZnO, $Pr_6O_{11}$, CoO, $Cr_2O_3$, $CaCO_3$, $SiO_2$, $K_2CO_3$, and $Al_2O_3$ onto a film by the doctor blade method so as to form a membrane, for example, in the thickness of about 30 μm.

Furthermore, green sheets for intermediate layers $11_1$-$11_3$ are prepared. The green sheets are formed, for example, by applying a slurry of a raw material of mixed powders consisting primarily of ZnO and $Fe_2O_3$, onto a film by the doctor blade method so as to form a membrane, for example, in the thickness of about 20 μm.

The subsequent step is to form the through-holes at the predetermined positions (i.e., positions where the through-holes are to be formed in the conductor portions $12_1$-$12_7$) in the green sheets for insulator layers $6_2$-$6_8$, by laser processing or the like.

The subsequent step is to form conductor patterns corresponding to the conductor portions $12_1$-$12_8$ on the green sheets for insulator layers $6_2$-$6_9$. The conductor patterns are formed by screen-printing a conductor paste consisting primarily of Ag and Pd, on the green sheets so that the patterns can have, for example, the thickness of about 7 μm after baked. The screen printing of the conductor paste on the green sheets results in filling the conductor paste in the through-holes formed in the green sheets for insulator layers $6_2$-$6_8$.

Conductor patterns corresponding to the hot electrode 16 and the ground electrode 17 are formed on the green sheets for varistor layers $8_2$, $8_3$. The conductor patterns are formed by screen-printing a conductor paste consisting primarily of Ag and Pd, on the green sheets so that the patterns can have, for example, the thickness of about 1.5 μm after baked.

The subsequent step is to stack the green sheets for insulator layers $6_1$-$6_9$, the green sheets for varistor layers $8_1$-$8_4$, and the green sheets for intermediate layers $11_1$-$11_3$ in the predetermined order, to press them, and to cut them in chip unit. Thereafter, the resultant is baked at a predetermined temperature (e.g., a temperature of about 1200° C.) to obtain the laminate 2.

The subsequent step is to form the input terminal electrode 3, output terminal electrode 4, and ground terminal electrodes 5 on the outer surfaces of the laminate 2, thereby completing the multilayer filter 1. Each of the terminal electrodes 3-5 is formed by transferring a conductor paste consisting primarily of Ag, onto an outer surface of the laminate 2, baking it at a predetermined temperature (e.g., a temperature of 700° C.-800° C.), and electroplating it with Ni/Sn, Cu/Ni/Sn, Ni/Au, Ni/Pd/Au, or Ni/Ag.

Figure 3:
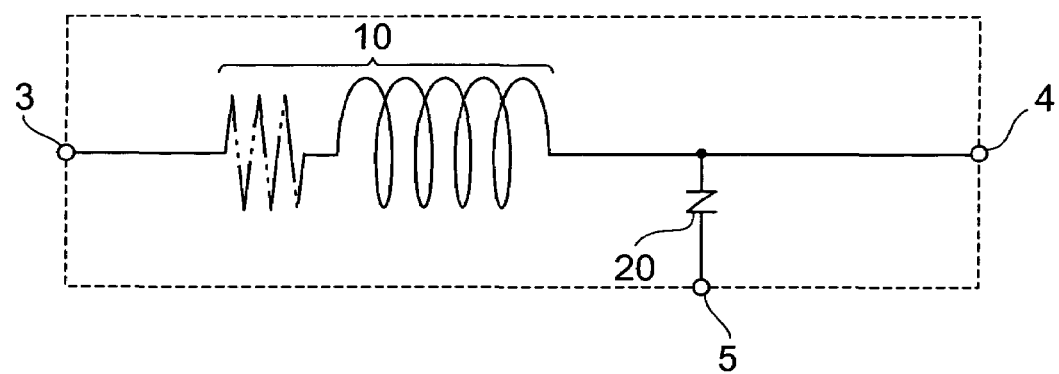
FIG. 3 is an equivalent circuit diagram of the multilayer filter according to the first embodiment.

As described above, the multilayer filter 1 constitutes an L-shape circuit of the inductor part 10 and varistor part 20, as shown in FIG. 3, and the inductor part 10 has the DC resistance of 4 Ω-100 Ω. This can prevent an electric current rapidly flowing by virtue of the varistor effect, from passing as noise, upon application of noise of a high voltage over the varistor voltage to the input.

The conductor portions $12_1$-$12_8$ are made of the material containing Ag and Pd. This permits the DC resistance of the inductor part 10 to be securely set higher, for example, in comparison with the case where the conductor portions $12_1$-$12_8$ are made of the material consisting primarily of Ag. Furthermore, the melting point of the conductor portions $12_1$-$12_8$ can be increased with certainty, for example, in comparison with the case where the conductor portions $12_1$-$12_8$ are made of the material consisting primarily of Ag. Therefore, when the laminate 2 is baked in the production process of the multilayer filter 1, the laminate 2 can be integrally baked at the baking temperature of the multilayer portion 9 (e.g., a temperature of about 1200° C.) generally higher than that of the multilayer portion 7 (e.g., a temperature of about 870° C.).

The intermediate layers $11_1$-$11_3$ having the coefficient of thermal expansion between that of the insulator layers $6_1$-$6_9$ and that of the varistor layers $8_1$-$8_4$ are laid between the multilayer portion 7 and the multilayer portion 9. This can prevent occurrence of a crack or delamination in the laminate 2 due to the difference between the coefficient of thermal expansion of the insulator layers $6_1$-$6_9$ and the coefficient of thermal expansion of the varistor layers $8_1$-$8_4$. Furthermore, it can also prevent diffusion of a component from the insulator layer $6_9$ or the like into the varistor layer $8_1$ or the like, and diffusion of a component from the varistor layer $8_1$ or the like into the insulator layer $6_9$ or the like, and enables the characteristics of the insulator layer $6_9$ or the like and the characteristics of the varistor layer $8_1$ or the like to be maintained at respective predetermined characteristics. The "distance along the stack direction of the multilayer portions 7, 9" between the conductor portion $12_8$ in the inductor part 10 and the ground electrode 17 in the varistor part 20 is preferably set to not less than 100 μm.

Second Embodiment

The multilayer filter 1 according to the second embodiment is different in the configuration of the multilayer portion 9 from the multilayer filter 1 according to the first embodiment.

Figure 4:
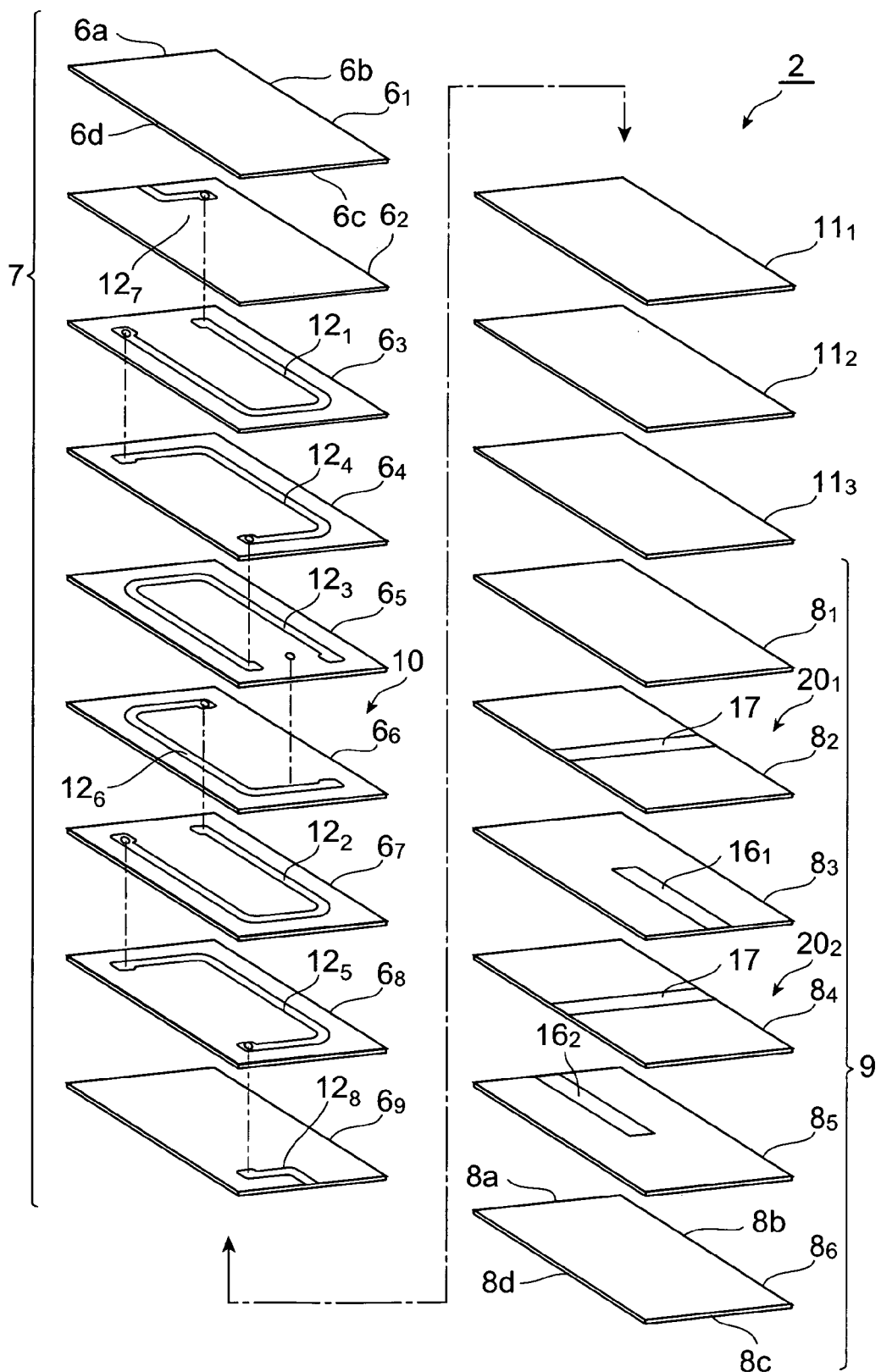
FIG. 4 is an exploded perspective view of a laminate in a multilayer filter according to the second embodiment.

Namely, the multilayer portion 9 is comprised of a stack of varistor layers $8_1$-$8_6$, as shown in FIG. 4. A hot electrode $16_1$, one end of which reaches the edge $8c$ to be electrically connected to the output terminal electrode 4, is formed on the varistor layer $8_3$ so as to extend along the edge $8b$ in the central region thereof, and a hot electrode $16_2$, one end of which reaches the edge $8a$ to be electrically connected to the input terminal electrode 3, is formed on the varistor layer $8_5$ so as to extend along the edge $8b$ in the central region thereof. Ground electrodes 17, two ends of which reach the edge $8b$ and the edge $8d$ to be electrically connected to the ground terminal electrodes 5, are formed on the varistor layers $8_2$, $8_4$, respectively, so as to extend along the edge $8a$ in the central region thereof In this configuration, the multilayer filter 1 comes to have a varistor part $20_1$ constructed so that the hot electrode $16_1$ electrically connected to the output terminal electrode 4, and the ground electrode 17 electrically connected to the ground terminal electrodes 5 are formed in the multilayer portion 9 with the varistor layer $8_2$ in between, and a varistor part $20_2$ constructed so that the hot electrode $16_2$ electrically connected to the input terminal electrode 3, and the ground electrode 17 electrically connected to the ground terminal electrodes 5 are formed in the multilayer portion 9 with the varistor layer $8_4$ in between.

Figure 5:
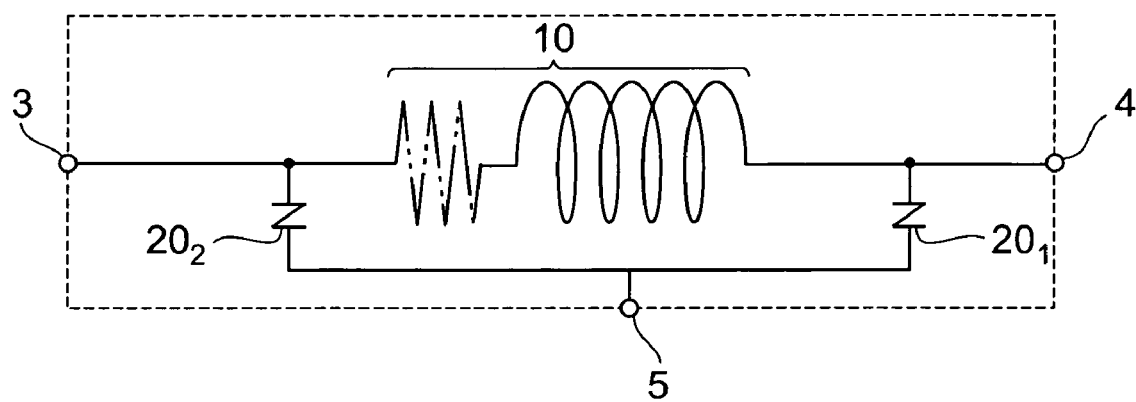
FIG. 5 is an equivalent circuit diagram of the multilayer filter according to the second embodiment.

The multilayer filter 1 constructed as described above constitutes a π-shape circuit of the inductor part 10 and varistor parts $20_1$, $20_2$, as shown in FIG. 5, and the inductor part 10 has the DC resistance of 4 Ω-100 Ω. This can prevent an electric current rapidly flowing by virtue of the varistor effect, from passing as noise, upon application of noise of a high voltage over the varistor voltage to the input.

Third Embodiment

The multilayer filter 1 according to the third embodiment is different from the multilayer filter 1 according to the first embodiment in that the filter is constructed in an array form.

Figure 6:
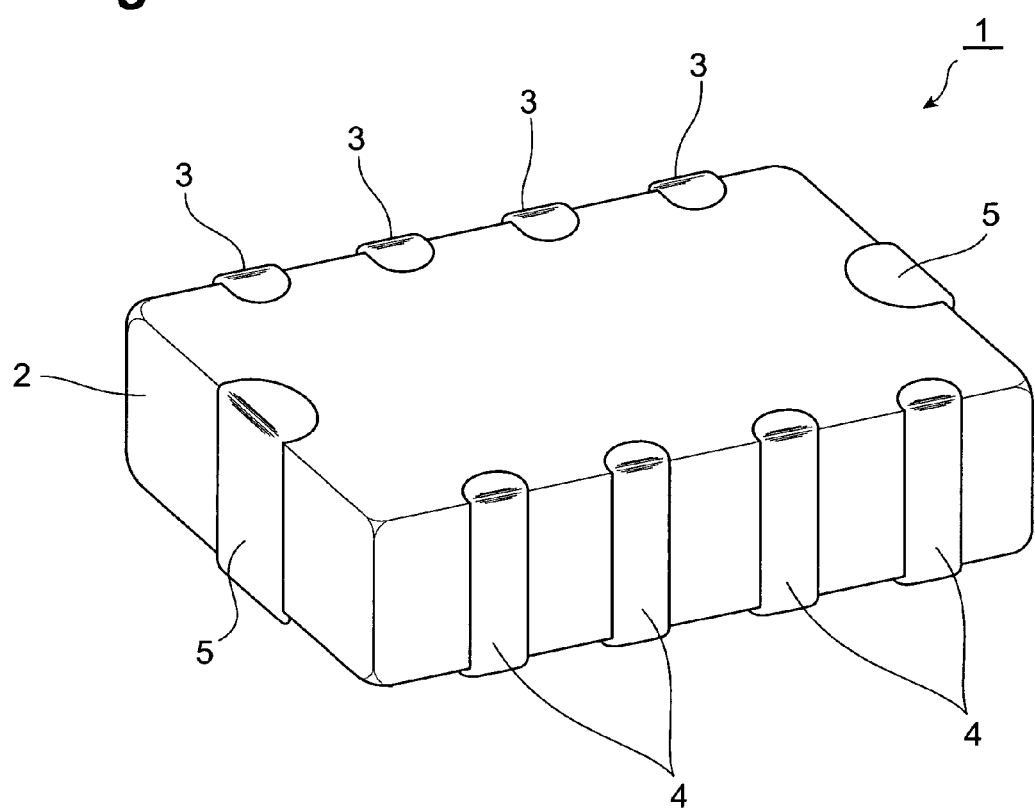
FIG. 6 is a perspective view of a multilayer filter according to the third embodiment.
Figure 7:
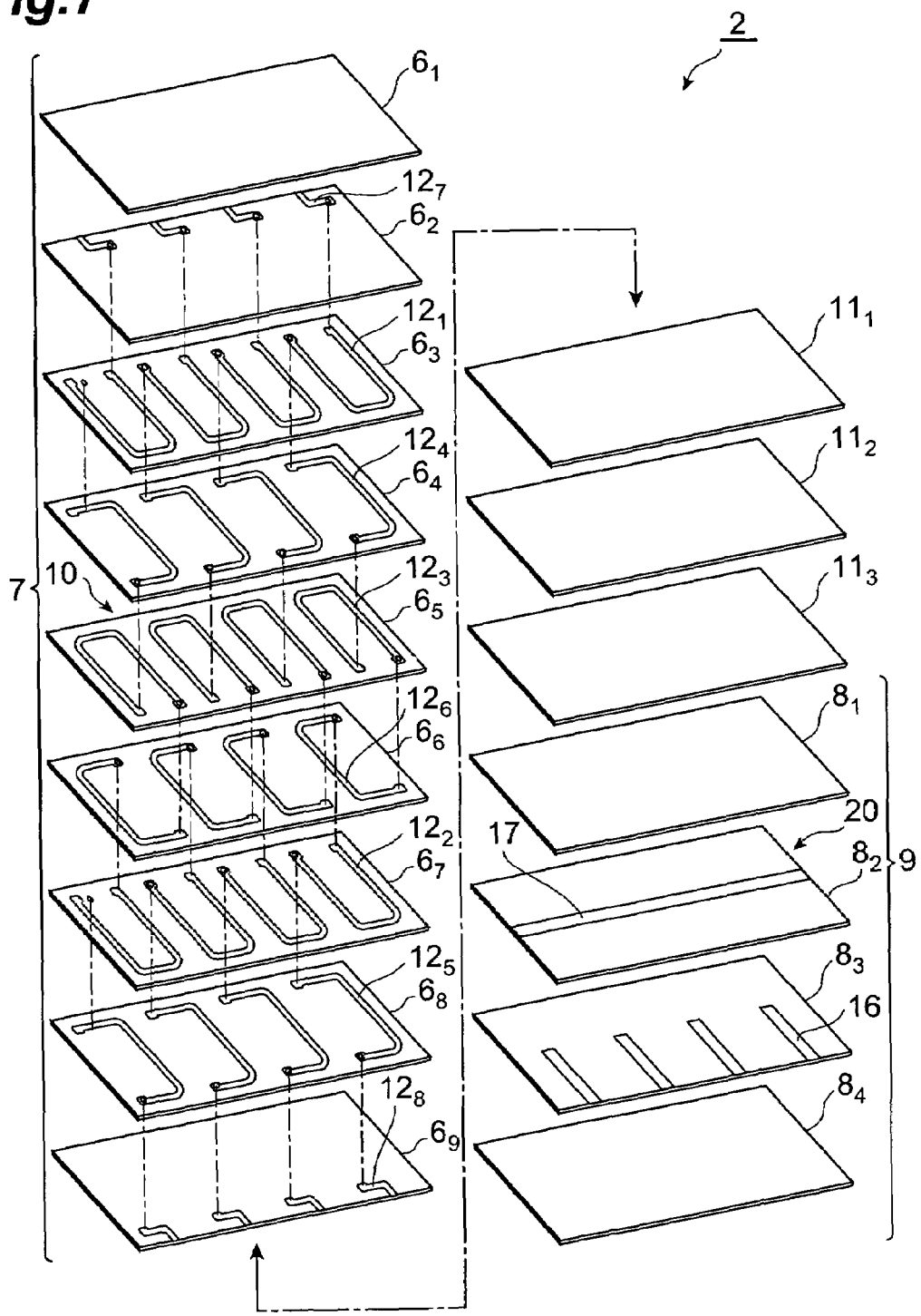
FIG. 7 is an exploded perspective view of a laminate in the multilayer filter according to the third embodiment.

Namely, as shown in FIG. 6, four pairs of terminal electrodes 3,4 are juxtaposed on the two end faces of the laminate 2 in the direction perpendicular to the longitudinal direction thereof. As shown in FIG. 7, four sets of inductor parts 10 are juxtaposed in the multilayer portion 7, and four sets of varistor parts 20 are juxtaposed in the multilayer portion 9.

Figure 8:
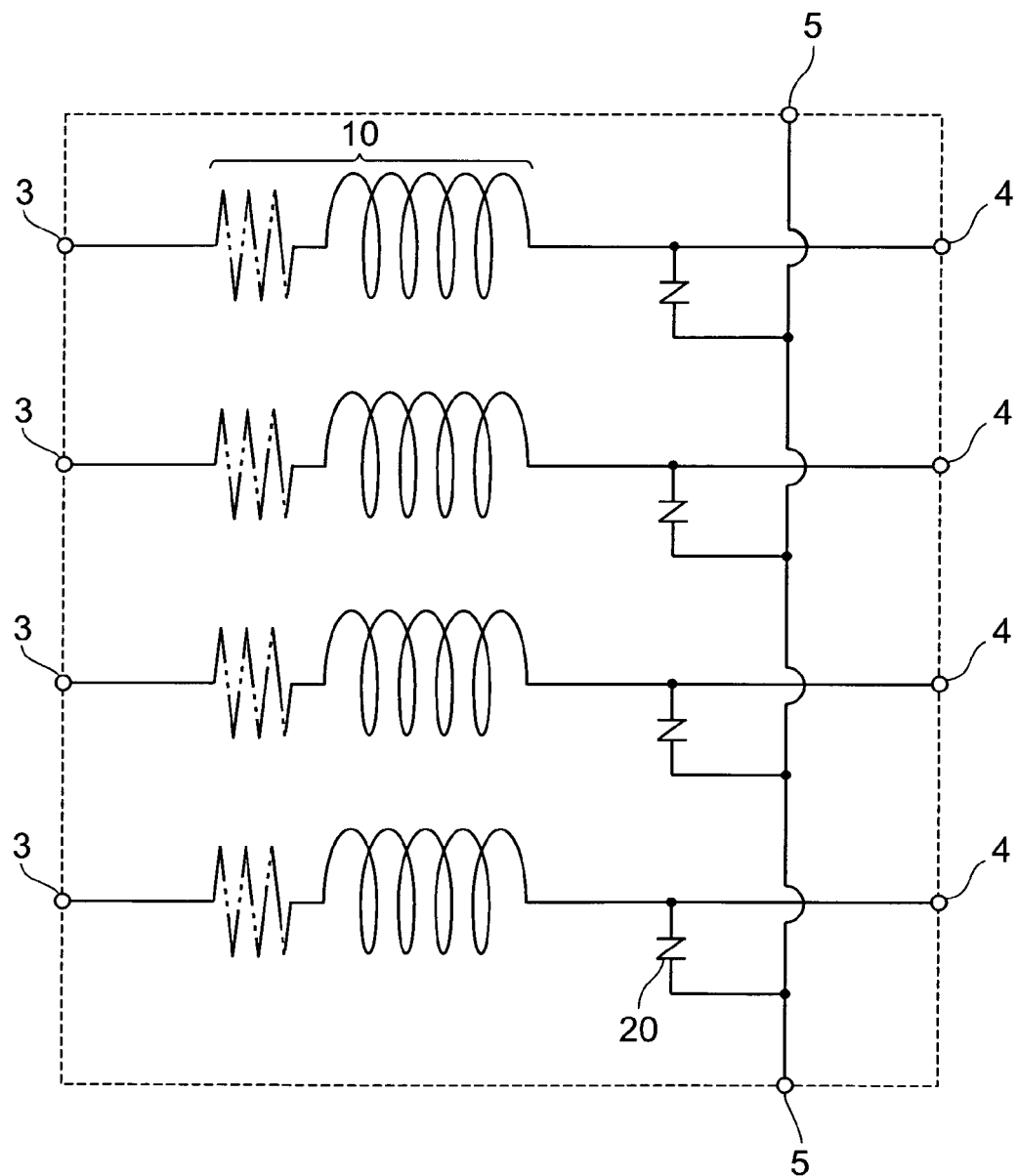
FIG. 8 is an equivalent circuit diagram of the multilayer filter according to the third embodiment.

The multilayer filter 1 constructed as described above constitutes four sets of L-shape circuits of the inductor parts 10 and the varistor parts 20, as shown in FIG. 8. The multilayer filter 1 constructed in the array form as described above also achieves the dumping effect.

Fourth Embodiment

The multilayer filter 1 according to the fourth embodiment is different from the multilayer filter 1 according to the second embodiment in that the filter is constructed in an array form.

Figure 9:
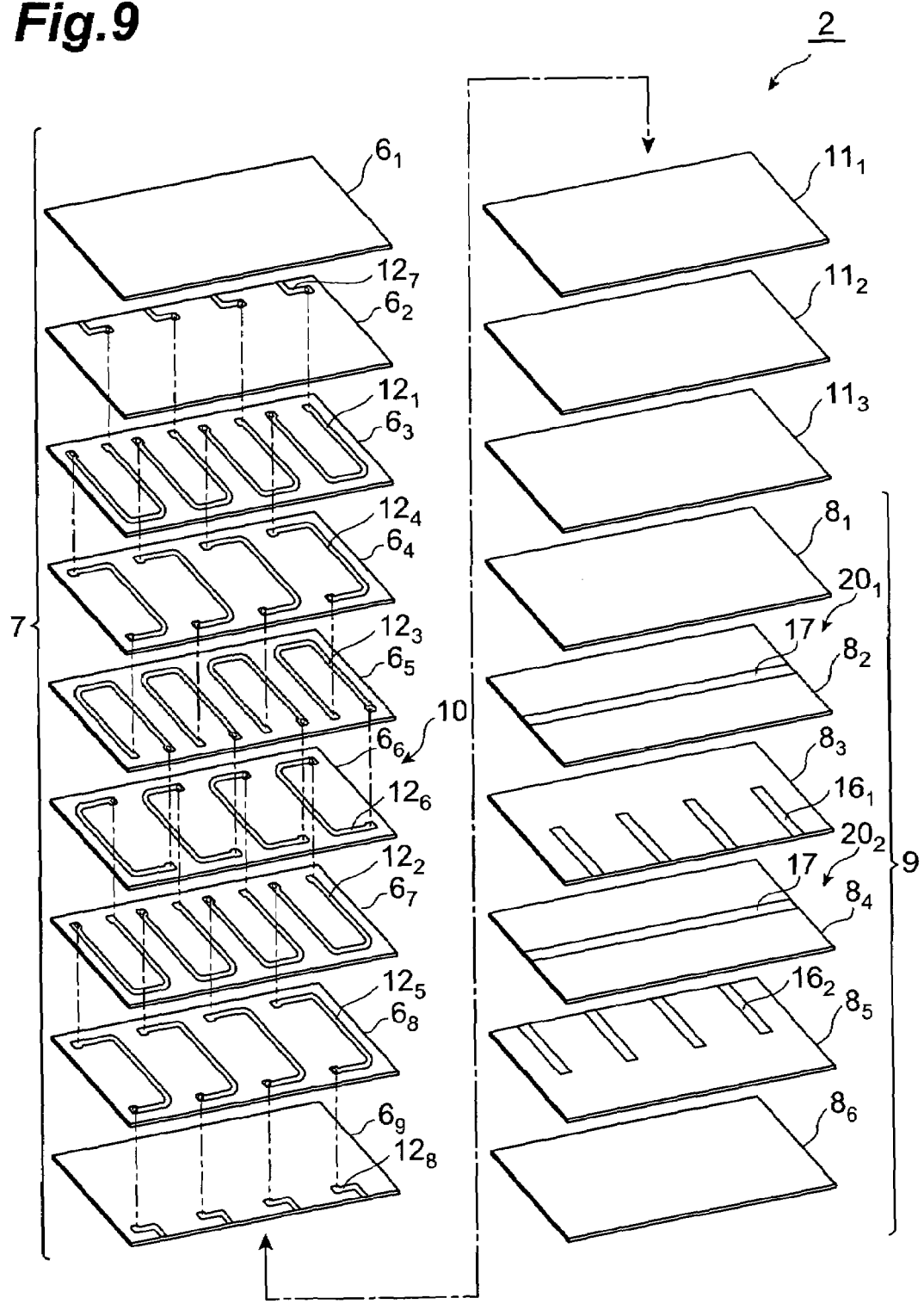
FIG. 9 is an exploded perspective view of a laminate in a multilayer filter according to the fourth embodiment.

Namely, as shown in FIG. 9, four sets of inductor parts 10 are juxtaposed in the multilayer portion 7, and four sets of varistor parts $20_1$ and four sets of varistor parts $20_2$ are juxtaposed in the multilayer portion 9.

Figure 10:
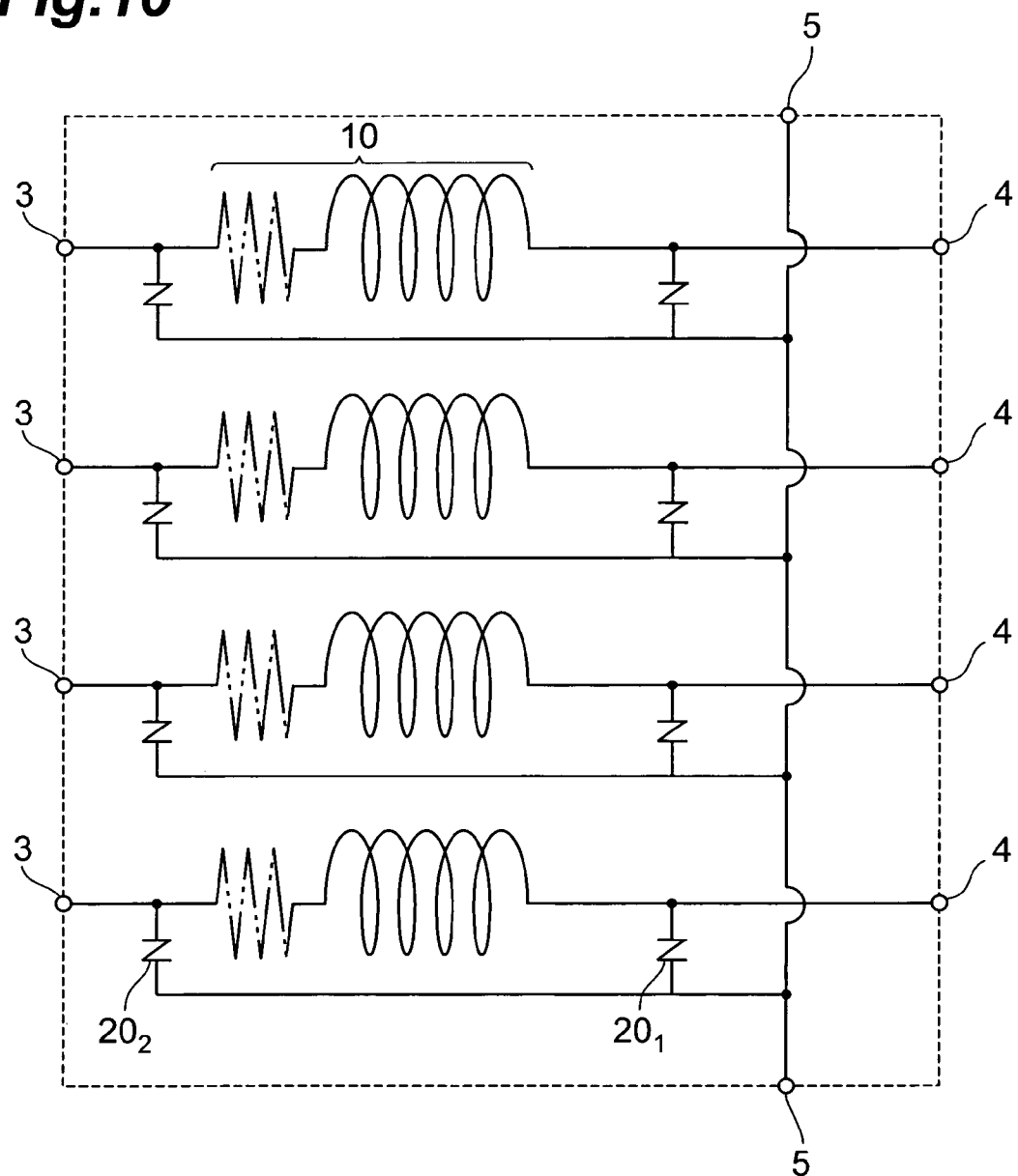
FIG. 10 is an equivalent circuit diagram of the multilayer filter according to the fourth embodiment.

The multilayer filter 1 constructed as described above constitutes four sets of π-shape circuits of the inductor parts 10 and the varistor parts $20_1$, $20_2$, as shown in FIG. 10. The multilayer filter 1 constructed in the array form as described above also achieves the dumping effect.

Table 1 below shows the relationship between percentages (% by weight) of Ag and Pd in the conductor portions $12_1$-$12_8$, and the DC resistance of the inductor part 10. It is apparent from this Table 1 that the DC resistance tends to increase with increase in the percentage of Pd and that the DC resistance can be readily controlled by changing the percentages of Ag and Pd. The data in Table 1 was obtained with the multilayer filter of the 4-set array form in which the complete dimensions were 2010 (length 2.0 mm, width 1.0 mm, thickness 0.8 mm) and in which turns in the inductor part were 10.5 T.

TABLE 1

| No. | PERCENTAGE OF Pd (%) | PERCENTAGE OF Ag (%) | DC RESISTANCE ($\Omega$) |
|---|---|---|---|
| 1 | 100 | 0 | 25.8 |
| 2 | 70 | 30 | 96.1 |
| 3 | 60 | 40 | 99.4 |
| 4 | 50 | 50 | 81.3 |
| 5 | 40 | 60 | 57.1 |
| 6 | 30 | 70 | 40.8 |
| 7 | 20 | 80 | 29.9 |
| 8 | 10 | 90 | 14.3 |
| 9 | 5 | 95 | 10.1 |
| 10 | 2 | 98 | 4.1 |
| 11 | 0 | 100 | 1.2 |

The present invention is by no means limited to the first to forth embodiments described above. For example, the multilayer filters 1 in the respective embodiments had the stack of intermediate layers 11$_1$-11$_3$ between the multilayer portion 7 and the multilayer portion 9, but the intermediate layers are not always essential in the multilayer filter according to the present invention. In this case, the insulator layers forming the inductor part are preferably made from green sheets formed by applying a slurry of a raw material of mixed powders of $ZnO$, $Pr_6O_{11}$, $Cr_2O_3$, $CaCO_3$, $SiO_2$, and $K_2CO_3$, onto a film by the doctor blade method.

The present invention prevents an electric current rapidly flowing by virtue of the varistor effect, from passing as noise, upon application of noise of a high voltage over the varistor voltage to the input.

What is claimed is:

1. A multilayer filter comprising:

a laminate having a first multilayer portion comprising a stack of insulator layers, and a second multilayer portion comprising a stack of varistor layers;

a first terminal electrode, a second terminal electrode, and a third terminal electrode formed on the laminate;

an inductor part which is constructed so that a plurality of conductor portions formed in the first multilayer portion are electrically connected to each other, one end of which is electrically connected to the first terminal electrode, and an other end of which is electrically connected to the second terminal electrode; and a varistor part which is constructed so that a first varistor electrode electrically connected to the first terminal electrode or to the second terminal electrode, and a second varistor electrode electrically connected to the third terminal electrode are formed in the second multilayer portion with the varistor layer in between, wherein the inductor part has a DC resistance of 4 $\Omega$-100 $\Omega$.

2. The multilayer filter according to claim 1, wherein the conductor portions are made of a material containing silver and palladium.

3. The multilayer filter according to claim 1, wherein an intermediate layer having a coefficient of thermal expansion between that of the insulator layers and that of the varistor layers is laid between the first multilayer portion and the second multilayer portion.

* * * * *